(12) United States Patent
Zhang

(10) Patent No.: US 7,126,325 B2
(45) Date of Patent: Oct. 24, 2006

(54) DIGITAL MULTI-METER WITH OPERATIONAL ERROR PREVENTION TECHNOLOGY USING LED AND MICROPROCESSOR WITH INPUT SOCKETS

(76) Inventor: Xianhong Zhang, Room 501, #71, Huaguang Garden, HongmeiLu, Shanghai (CN)

( * ) Notice: Subject to any disclaimer, the term of this patent is extended or adjusted under 35 U.S.C. 154(b) by 0 days.

(21) Appl. No.: 10/977,482

(22) Filed: Oct. 29, 2004

(65) Prior Publication Data
US 2005/0146318 A1    Jul. 7, 2005

Related U.S. Application Data

(63) Continuation of application No. PCT/CN02/00479, filed on Jul. 5, 2002.

(30) Foreign Application Priority Data
May 22, 2002    (CN)    ................ 02 2 17583

(51) Int. Cl.
G01R 1/00    (2006.01)
G01R 1/38    (2006.01)
(52) U.S. Cl. ...................... 324/110; 324/115
(58) Field of Classification Search ............ None
See application file for complete search history.

(56) References Cited
U.S. PATENT DOCUMENTS
4,604,569 A  *  8/1986  Tedd et al. ............ 324/110

5,153,511 A  * 10/1992  Lee ........................ 324/115
5,619,129 A    4/1997  Kamiya
6,218,824 B1   4/2001  Oldstead et al.

FOREIGN PATENT DOCUMENTS
DE    19954182 A1    5/2001
JP    10177042       6/1998

OTHER PUBLICATIONS

"8-Bit Microcontroller with 2K Bytes Flash, AT89C2051", AMTEL Dec. 1997.*

* cited by examiner

Primary Examiner—Paresh Patel
(74) Attorney, Agent, or Firm—Dorsey & Whitney LLP

(57) ABSTRACT

The present utility model provides a digital multi-meter that can not only; generate warning signal when the test probe is misplugged but also indicate the assigned socket before the probe is plugged in. The multi-meter contains a socket indicating a misplug warning circuit whose micro-control unit is connected with each measurement function switch via its terminals respectively. When any measurement function switch is closed and its corresponding socket is unclosed, the micro-control unit switches on the relevant LED to emit light via connected terminal in order to indicate the assigned docket. On the contrary, the micro-control unit switches off the LED to stop emitting light in order to indicated the proper operation. The multi-meter can indicate not only mis-operation after the probe has been plugged in but also the assigned socket before it so that it decreases the possibility of mis-operation and avoids damage effectively and elongates its working life.

6 Claims, 2 Drawing Sheets

DIGITAL MULTI-METER WITH OPERATIONAL ERROR PREVENTION TECHNOLOGY USING LED AND MICROPROCESSOR WITH INPUT SOCKETS

CROSS-REFERENCE TO RELATED APPLICATION(S)

This application is a continuation of International Patent Application No. PCT/CN02/00479, filed on Jul. 5, 2002, which claims priority to Chinese Patent Application No. 02217583.0, filed on May 22, 2002, the contents of which are incorporated in their entirety by reference herein.

TECHNICAL FIELD

This invention relates to digital testing device, particularly, relates to a new type of digital multi-meter, which possesses an error prevention capability.

BACKGROUND

During the use of a multi-meter or other electronics test equipment, if the test leads are incorrectly inserted, this will damage the equipment. Based on experience in repairing damaged meters, over 50% of the cases are caused by the incorrect insertion of the test leads. As a result, some manufacturers added warning buzzers or other sound devices to alert the user that the meter has been damaged. Unfortunately, these warning devices are activated only after the equipment has been damaged, therefore it cannot prevent the meter from being damaged.

SUMMARY OF THE INVENTION

The objective of this new invention is to not only warn the user after the wrong insertion of the test lead but also indicate the correct place for user to insert the test lead.

As a result, we are introducing a type of digital multi-meter which includes all the regular functions, AC V, DC V, AC A, DC A, and Resistance (include diode and continuity test) and their corresponding jack for test lead insertion. In addition, there also includes a circuit that will indicate the right jack to be used as well as a warning buzzer to sound a wrongly inserted test lead.

This circuit includes the following components.

Microprocessor Control Unit (MCU) that contains separate switches for Voltage/Ohm testing, mA/uA testing and large current testing and their connecting points for corresponding jacks of each switch.

three LED to indicate the Voltage/Ohm testing function, mA/uA testing function and large current testing function. When a function switch has been closed and the associated test jack has not been plugged in, the MCU signals the associated control pin to light up the LED beside the correct testing function jack therefore indicating to the user the correct jack to be used. Accordingly, when a function switch has been closed and the associated test jack has been plugged in, the MCU signals the associated control pin to shut off the LED therefore indicating to the user the correct jack has been inserted for testing.

Sound device is an independent unit within the MCU. When a function switch has been closed and an incorrect test jack has been plugged in, the MCU signals the associated control pin to activate a buzzer thus warning the user that an incorrect operation has been performed.

In using this new digital multi-meter, the advantage is not only alerting the user when the test lead is wrongly inserted but also indicating the correct jack that should be used according to the chosen function. It reduces the chance of wrongly operating the meter, thus prevents the meter from damage and prolongs the useful life span of the meter.

THE PREFERRED EMBODIMENTS OF THE INVENTION

Digital multi-meter typically includes testing functions and testing function selection switches. The input analog signals received from the test lead are translated into digital signals via a digital (A/D) translation circuit and the result of the test is then shown on a liquid crystal display. In using the new digital multi-meter, there also includes an indicator to show the correct jack for the leads to be inserted and a circuit system to warn the user when a lead has been incorrectly inserted. The above are all connected to the Voltage/Ohm testing function, mA/uA testing function and large current testing function and the respective function switches.

The function switch, A/D translation circuit and liquid crystal display components are all understood by the respective technicians and these are not specifically associated with this new innovation. As a result, the mechanics of these components will not be elaborated any further in this document. Below, FIGS. 1 & 2 illustrate the make-up and mechanics of the lead jack indicator and warning circuit system.

Figure 1:
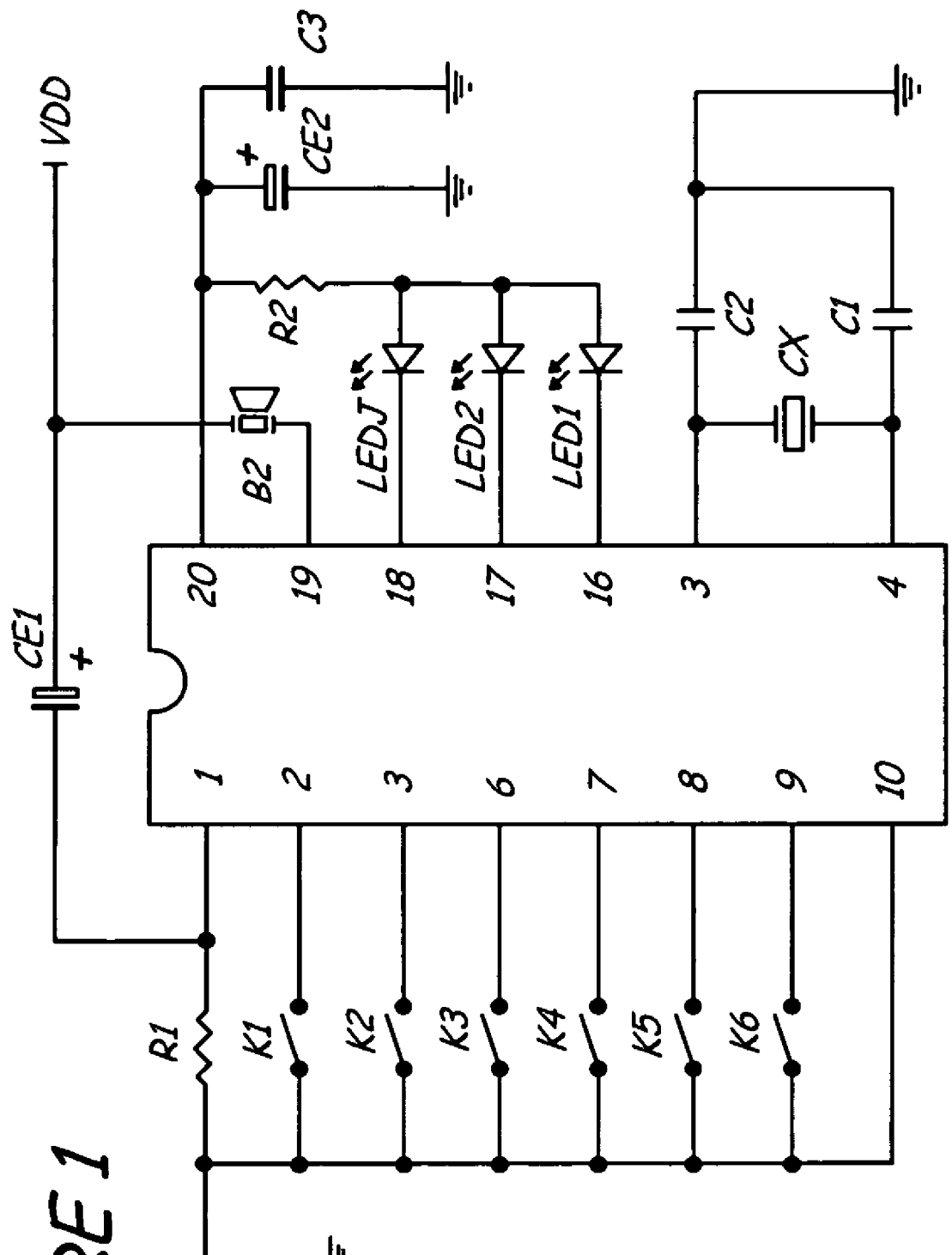
FIG. 1. An example of a circuit diagram of the jack and warning system of a digital multi-meter.
Figure 2:
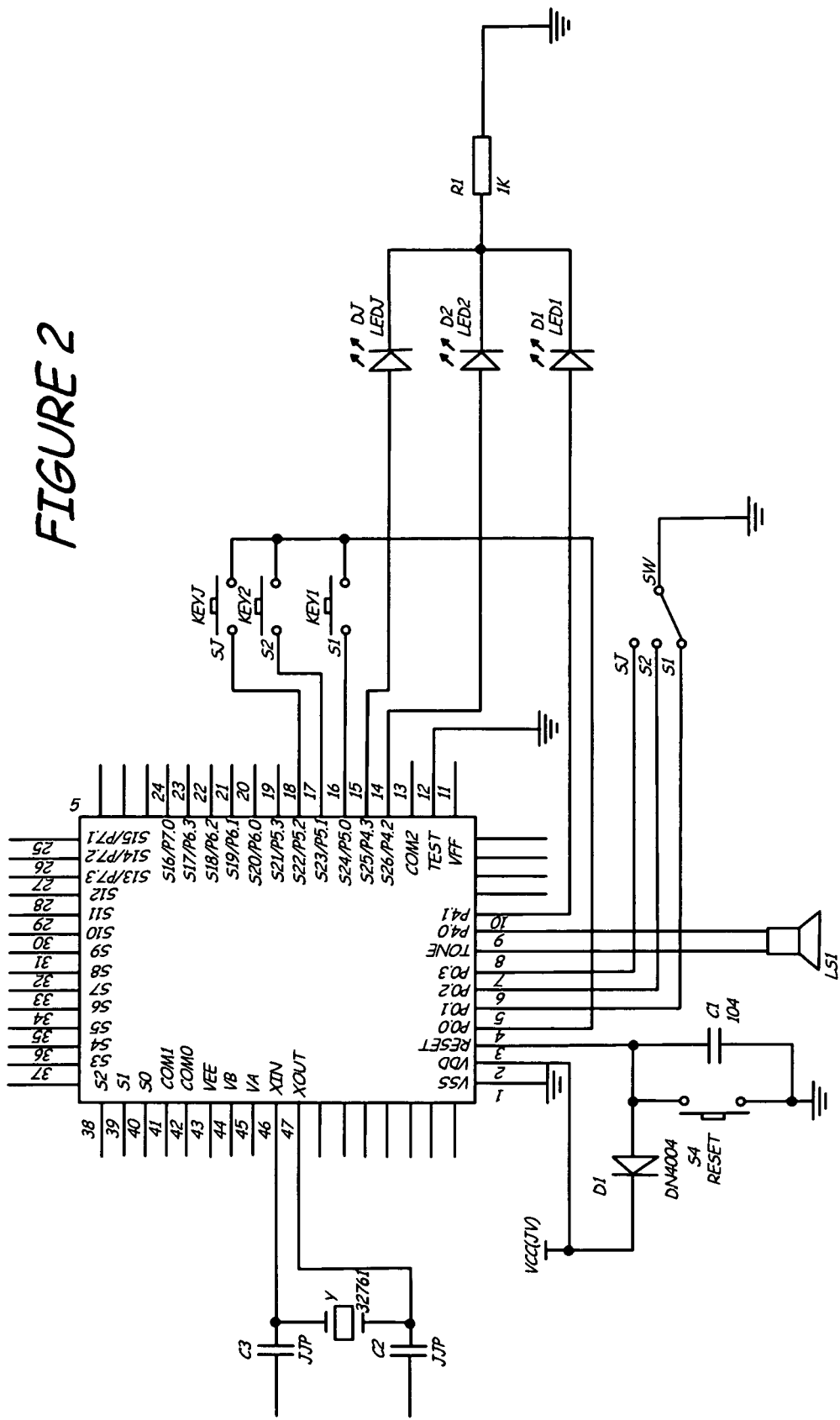
FIG. 2. Another example of a circuit diagram of the jack and warning system of a digital multi-meter.

FIG. 1. An example of a circuit diagram of the jack and warning system As shown in FIG. 1, the Voltage/Ohm testing function switch "K1", the mA/uA testing function switch "K2", the large current testing switch "K3", the Voltage/Ohm testing jack "K4", the mA/uA testing jack "K5", and the large current testing jack switch "K6" are connected respectively to pins "2", "3", "6", "7", "8" and "9" of IC89C2051. The buzzer "Bz" is connected to pin "19", LED1 (beside the V/ohm jack) to pin "16", LED2 (beside the mA/uA jack) to pin "17" and LED3 (beside the A jack) to pin "18". The crystal CX with capacitor C1 and C2 form an OSC circuit that generates a 4 MHz clock signal for IC89C2051 through pin4 and pin5. The resistor R1 and R2, the capacitor CE1, CE2 and C3 work together for supplying the working voltage and current to the IC.

Following is an illustration of the operation using Voltage measurement as an example. Typically digital multi-meters contain one black and one red test lead. If the black test lead is plugged into the common (COM) jack and the function switch is set to "V" range, the Voltage/Ohm testing function switch "K1" will be closed. This signals the IC to set the pin "16" at –"V" level to light up the LED1 thus guiding the user to insert the red test lead into the Voltage/Ohm test jack. If the red test lead is correctly inserted into the "V" jack, the switch "K4" will be closed and it signals the IC to set pin "16" at 0V to shut off the LED1 thus indicating that operation has been carried out correctly.

If the red test lead is wrongly inserted into the mA/uA or large current testing jack, the switch "K4" will remains open but K5 or K6 will be closed. This will causes the IC89C2051 to signal the pin "19" to make the buzzer warning sound thus alerting the user not to continue the operation. The same principle applies to other operations such as resistance and current measurement. As seen above, FIG. 1 has explained the digital multi-meter's ability, using this new technology, to prevent instrument damage caused by inserting the test lead into the wrong jack and the associated warning system.

FIG. 2 is another sample circuit diagram of the jack and warning system. As shown in FIG. 2, the Voltage/Ohm testing function switch "SK1", the mA/uA testing function switch "SW2", the large current testing switch "SW3", the Voltage/Ohm testing jack "KEY1", the mA/uA testing jack "KEY2", and the large current testing jack "KEY3" are connected respectively to pins "P0.1", "P0.2", "P0.3", "P5.0", "P5.1" and "P5.2" of IC EM73P361. The buzzer, LS1, is connected to the pins of "TONE" and P4.0, LED1 (beside the V/ohm jack) to P4.1, LED2 (beside the mA/uA jack) to P4.2 and LED3 (beside the A jack) to P4.3. The crystal Y with capacitor C2 and C3 form an OSC circuit that generates a clock signal for IC EM73P361 through Xin and Xout. The resistor R1, the capacitor C1 and other parts work together for supplying the working voltage and current to the IC.

Following is an illustration of the operation using Voltage measurement as an example. If the black test lead is plugged into the common (COM) jack and the function switch is set to "V" range, the Voltage/Ohm testing function switch "SW1" will be closed. This signals the IC EM73P361 to set the pin "P4.1" at −"V" level to light up the LED1 thus guiding the user to insert the red test lead into the Voltage/Ohm test jack. If the red test lead is correctly inserted into the "V" jack, the switch "SW1" will be closed and it signals the IC to set pin "P4.1" at 0V to shut off the LED1 thus indicating that operation has been carried out correctly. If the red test lead is wrongly inserted into the mA/uA or large current testing jack, the switch "KEY1" remains open. This will causes the IC89C2051 to signal the pin "TONE" and "P4.0" sound device "SPEAKER" to make the buzzer warning sound thus alerting the user not to continue the operation. The same principle applies to other operations such as resistance and current measurement. As seen above, FIG. 2 has explained the digital multi-meter's ability, using this new technology, to prevent instrument damage caused by inserting the test lead into the wrong jack and the associated warning system.

Worth noting is that the above is a suggested use of this new technology. As far as the specialists and technologists are concerned, there can be many other applications to this technology using other instruments. For example using different IC to complete a plug-jack indication and warning system. Furthermore, the testing functions are not limited to Voltage/Ohm, uA/mA, and large current. This technology is compatible with other testing function capabilities.

The invention claimed is:

1. A digital multi-meter, comprising a switch for voltage/Ohm, a switch for mA/uA testing, a switch for large current testing, and connecting jacks for said switches, wherein, further comprising a circuit for indicating inserted jack and warning wrong insertion, said circuit comprising:

a microprocessor control unit (MCU), including pins for connecting said switches and said jacks;

three LEDs for indicating voltage/Ohm testing function, mA/uA testing function and large current testing function, when a function switch has been closed and the associated test jack has not been plugged in, said MCU signals the associated control pin to light up the LED beside the correct testing function jack therefore indicating to the user the correct jack to be used, when a function switch has been closed and the associated test jack has been plugged in, said MCU signals the associated control pin to shut off the LED therefore indicating to the user the correct jack has been inserted for testing, when a function switch has been closed and an incorrect test jack has been plugged in, the MCU signals the associated control pin to activate the LED to flash therefore warning the user an incorrect operation has been performed;

sound device connecting to a pin of said MCU, said pin being turn on and off under the control of said MCU, when a function switch has been closed and an incorrect test jack has been plugged in, said MCU signals said pin to activate said sound device thus warning the user that an incorrect operation has been performed;

wherein under any single fault condition including that one of the LED or sound device malfunctions, the circuit still warns the user that an incorrect operation has been performed.

2. The digital multi-meter according to claim 1, wherein, said MCU is IC892051.

3. The digital multi-meter according to claim 1, wherein, said MCU is EM73P361.

4. The digital multi-meter according to claim 1, wherein, said sound device is a buzzer.

5. The digital multi-meter according to claim 2, wherein, said sound device is a buzzer.

6. The digital multi-meter according to claim 3, wherein, said sound device is a buzzer.

* * * * *